(12) United States Patent
Kunimoto et al.

(10) Patent No.: US 7,598,608 B2
(45) Date of Patent: Oct. 6, 2009

(54) MOUNTING SUBSTRATE

(75) Inventors: Yuji Kunimoto, Nagano (JP); Atsunori Kajiki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 4 days.

(21) Appl. No.: 11/736,916

(22) Filed: Apr. 18, 2007

(65) Prior Publication Data

US 2007/0252286 A1 Nov. 1, 2007

(30) Foreign Application Priority Data

Apr. 26, 2006 (JP) .............................. 2006-122114

(51) Int. Cl.
*H01L 23/52* (2006.01)
(52) U.S. Cl. ....................... 257/692; 257/666; 257/668; 257/E21.503
(58) Field of Classification Search ................. 257/692, 257/778, 723, 734, E21.503
See application file for complete search history.

(56) References Cited

U.S. PATENT DOCUMENTS

| | | | |
|---|---|---|---|
| 6,448,660 B2 * | 9/2002 | Shibata | 257/777 |
| 2005/0248037 A1 * | 11/2005 | Hung et al. | 257/778 |
| 2006/0261494 A1 * | 11/2006 | Miyazaki et al. | 257/779 |

FOREIGN PATENT DOCUMENTS

JP 2000-77471 3/2000

* cited by examiner

*Primary Examiner*—Cuong Q Nguyen
*Assistant Examiner*—Cathy N Lam
(74) *Attorney, Agent, or Firm*—Rankin, Hill & Clark LLP

(57) ABSTRACT

There is provided a mounting substrate on which a semiconductor chip is mounted using a flip chip bonding, having a plurality of connection pads which are connected to the semiconductor chip, and an insulation layer formed in such a manner as to cover the connection pads partially, wherein the insulation layer includes a first insulation layer which is formed in such a manner as to correspond to a center of the semiconductor chip and a second insulation layer which is formed in such a manner as to surround the first insulation layer, and wherein the plurality of connection pads include first connection pads which are partially covered by the first insulation layer and second connection pads which are partially covered by the second insulation layer.

5 Claims, 11 Drawing Sheets

FIG. 7A
FIG. 7B
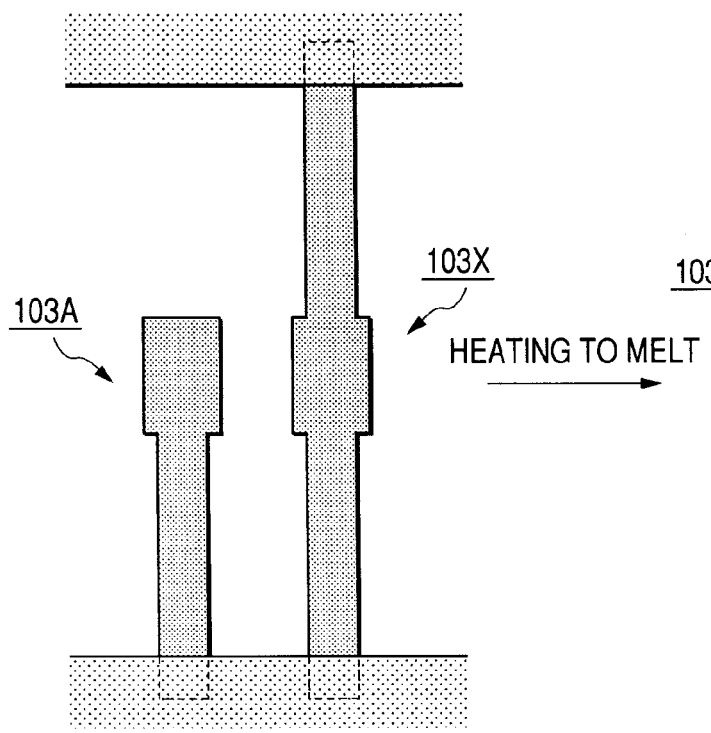
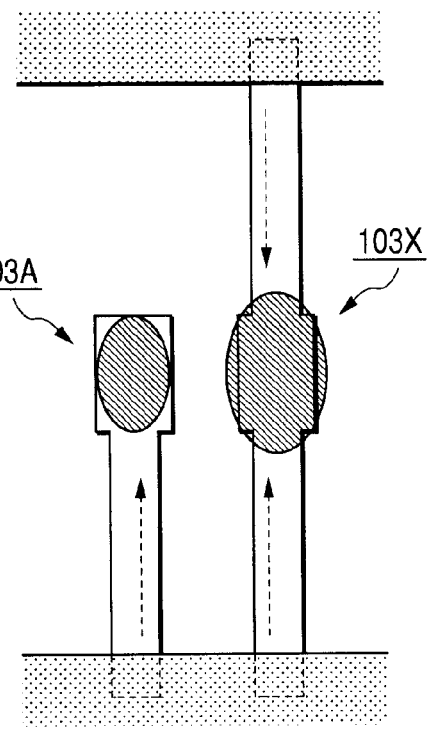

MOUNTING SUBSTRATE

This application claims priority to Japanese Patent Application No. 2006-122114, filed Apr. 26, 2006, in the Japanese Patent Office. The priority application is incorporated by reference in its entirety.

TECHNICAL FIELD

The present disclosure relates to a mounting substrate on which a semiconductor chip is mounted using a flip chip bonding.

RELATED ART

Although there have been proposed various methods of mounting a semiconductor chip on a mounting substrate, for example, a method of mounting a semiconductor chip on a mounting substrate using the flip chip bonding is characteristic in that a package can easily be made small in size and thin in thickness.

FIG. 1 is a plan view showing an example of a configuration of a mounting substrate on which a semiconductor chip is mounted using the flip chip bonding.

Referring to FIG. 1, in a mounting substrate 10, connection pads 13 are formed on an insulation layer 11 for connection to a semiconductor chip. A solder resist layer 12 having a opening 14 through which the connection pads 13 are exposed is formed on the insulation layer 11. The solder resist layer 12 is made up of solder resist layers 12A, 12B which are formed to be separated from each other across the opening 14. In this case, ends of the connection pads 13 are constructed to be covered by the solder resist layers 12A, 12B, respectively.

A semiconductor chip 15 (as a matter of convenience in drawing, only briefly indicated by dotted lines for the sake of easy identification), which is to be mounted on the mounting substrate 10, is mounted thereon so that connecting portions (not shown) such as solder bumps which are formed on electrodes of the semiconductor chip 15 are brought into electrical connection with the connection pads 13.

In addition, a resin referred to as an underfill is infiltrated between the semiconductor chip 15 and the mounting substrate 10, so as to realize an insulation between the adjacent connecting portions (connection pads).

[Patent Document No. 1] Japanese Patent Unexamined Publication No. 2000-77471

In recent semiconductor chips, however, intervals at which connecting portions are placed are narrowed so as to increase the number of connecting portions to be placed, and thus, the trend of so-called narrow interval arrangement (or multiple-pin arrangement) has been progressing. When a semiconductor chip like this is attempted to be mounted on a mounting substrate using the flip chip bonding, there has existed a case where the mounting of the semiconductor chip becomes difficult with the related-art mounting substrate.

FIG. 2 is an enlarged view of a portion lying in the vicinity of a corner portion of the mounting substrate 10 shown in FIG. 1. Note that, however, like reference numerals will be given to those that have already been described before, so that the description thereof will be omitted. As the number of pins to be placed increases, the intervals at which the connection pads 13 are placed become narrower in association therewith, and furthermore, the connection pads 13 have to also be formed even in areas closer to the corner portions of the mounting substrate 10. As this occurs, as is shown in FIG. 2, the connection pads come to interfere with each other in the corner portion of the mounting substrate 10, leading to a problem that the placement of the connection pads becomes difficult, in particular, in the corner portions.

SUMMARY

Embodiments of the present invention provide a mounting substrate.

More specifically, embodiments of the present invention provide a mounting substrate which can deal with the trend of narrowing the intervals at which the connecting portions are placed on the semiconductor chip which is mounted on the mounting substrate.

According to an aspect of one or more embodiments of the invention, a mounting substrate on which a semiconductor chip is mounted using a flip chip bonding, comprises a plurality of connection pads to be connected to the semiconductor chip, and an insulation layer formed in such a manner as to cover the connection pads partially, wherein the insulation layer includes a first insulation layer which is formed in such a manner as to correspond to a center of the semiconductor chip and a second insulation layer which is formed in such a manner as to surround the first insulation layer, and wherein the plurality of connection pads include first connection pads which are partially covered by the first insulation layer and second connection pads which are partially covered by the second insulation layer.

According to one or more embodiments of the invention, it becomes possible to provide the mounting substrate which can deal with the trend of narrowing the intervals at which the connecting portions are placed on the semiconductor chip which is mounted on the mounting substrate.

In addition, the insulation layer may be made up of a solder resist layer.

Additionally, the first insulation layer may be formed into a quadrangle, and the second connection pads may be placed in the vicinity of corner portions of the quadrangle, whereby the mutual interference of the connection pads in the vicinity of the corner portions can be suppressed effectively.

In addition, in the event that an exposed area of the first connection pad and an exposed area of the second connection pad are the same, the reliability in connection between the connection pads and the semiconductor chip can be improved.

Additionally, in the event that the mounting substrate further has third connection pads which are exposed from an opening formed in the first insulation layer, a semiconductor chip having connection pads at its central portion can be mounted.

In addition, in the event that an exposed area of the third connection pad is the same as the exposed area of the first connection pad and the exposed area of the second connection pad, the reliability in connecting the semiconductor chip to the mounting substrate can be improved.

One or more embodiments of the present invention may include one or more the following advantages. For example, it becomes possible to provide the mounting substrate which can deal with the trend of narrowing the intervals at which the connecting portions are placed on the semiconductor chip which is mounted on the mounting substrate.

The mounting substrate has both the first connection pads which are partially covered by the first insulation layer and the second connection pads which are partially covered by the second insulation layer. Because of this, the first connection pads or the second connection pads can be disposed in such a manner as to be connected to the connecting portions of the semiconductor chip which are placed at narrower intervals.

For example, the second connection pads are disposed in the vicinity of the corner portions of the first insulation layer formed which is formed substantially into the quadrangle so as to match the semiconductor chip which is also formed substantially into a quadrangle as viewed from the top thereof, thereby making it possible to avoid the interference of the connection pads. In addition, since both the first connection pads and the second connection pads are formed, there is provided an advantage that the degree of freedom in laying out a connection path using the connection pads is increased.

Other features and advantages may be apparent from the following detailed description, the accompanying drawings and the claims.

BRIEF DESCRIPTION OF THE DRAWINGS

FIGS. 7A, 7B are drawings which show a problem inherent in related-art connection pads.

DETAILED DESCRIPTION

Next, embodiments of the mounting substrate will be described based on the accompanying drawings.

First Embodiment

Figure 3:
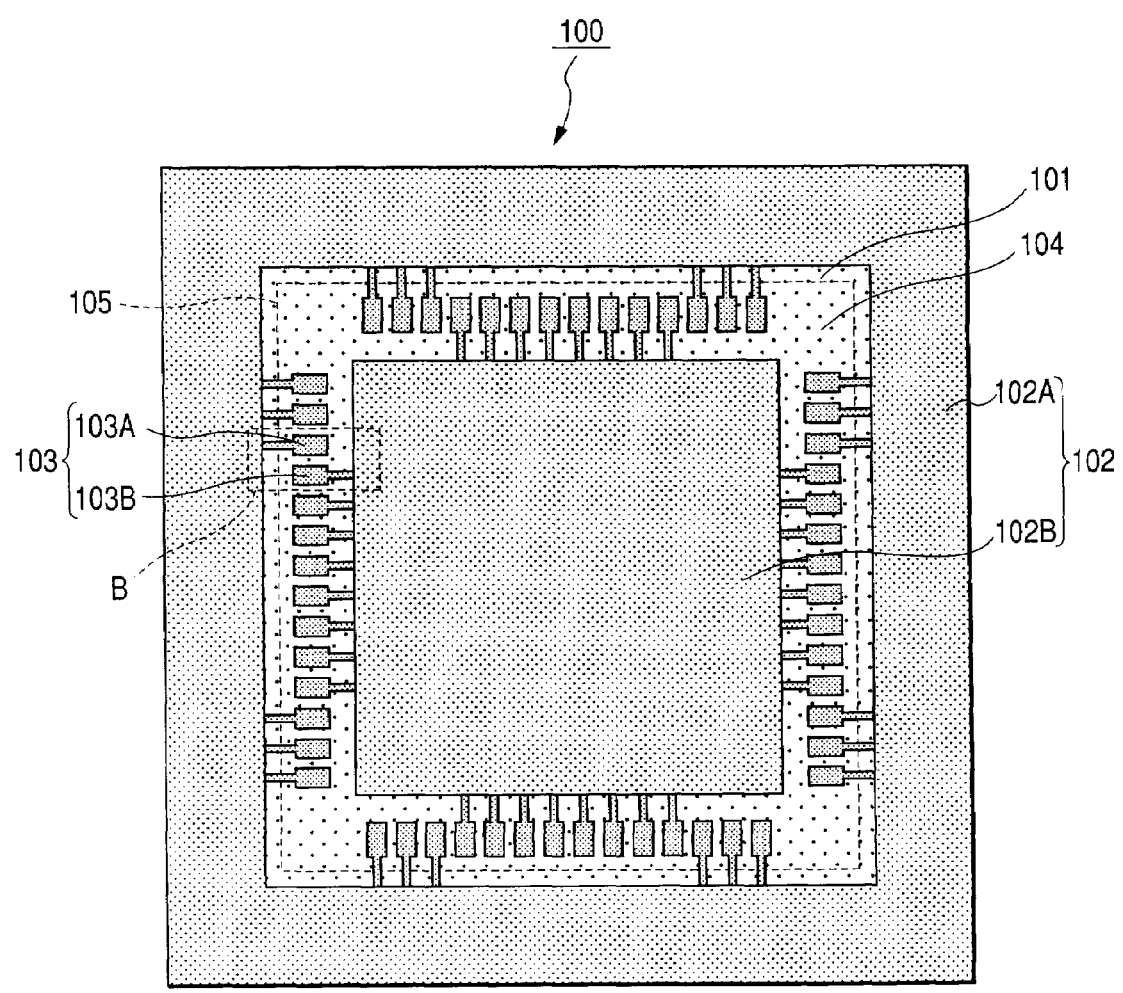
FIG. 3 is a drawing which shows a mounting substrate according to a first embodiment.

FIG. 3 is a plan view showing exemplarily a mounting substrate 100 according to a first embodiment of the invention. Referring to FIG. 3, the mounting substrate 100 shown in the figure has a construction in which connection pads 103 adapted to be connected to a semiconductor chip are formed on an insulation layer 101. The connection pads 103 are covered partially by an insulation layer (a solder resist layer) 102 which is formed on the insulation layer 101.

The solder resist layer is formed into a solder resist layer 102A and a solder resist layer 102B which are separated from each other across an opening or a space 104. The solder resist layer 102B is formed so as to mach the shape of the semiconductor chip and is formed into, for example, a quadrangular shape having four sides as viewed from the top thereof. Further each of the four sides of the solder resist layer 102B has a central region sandwiched between a first end region and a second end region. On the other hand, the solder resist layer 102A is formed so as to surround the solder resist layer 102B.

The connection pads 103 are formed on the insulation layer 101 in such a manner as to be partially exposed from the opening 104. The connection pads 103 are configured so as to include connection pads 103A which are covered by the solder resist layer 102A at end portions thereof and connection pads 103B which are covered by the solder resist layer 102B at end portions thereof.

Namely, in the mounting substrate 100 of this embodiment, the connection pads which are connected to the semiconductor chip are configured so as to include the connection pads 103B which are covered by the solder resist layer 102B which is formed at a central portion of the mounting substrate and the connection pads 103A which are covered by the solder resist layer 102A which is formed at a circumferential edge portion of the mounting substrate.

Because of this, in the mounting substrate, the connection pads 103A and the connection pads 103B can be disposed at narrow intervals while avoiding the interference therebetween. Consequently, the semiconductor chip in which the connecting portions are placed at narrower intervals (that is, more pins are placed) can easily be mounted on the mounting substrate.

For example, the connection pads 103A which are covered by the solder resist layer 102A at the end portions (or whose end portions are extended towards a circumferential edge portion of the mounting substrate) are placed in the vicinity of corner portions of the mounting substrate 100 (or in the vicinity of corner portions of the solder resist layer 102B). In this case, the connection pads 103A are formed in such a manner as not to be brought into contact with the solder resist layer 102B.

Because of this, in the vicinity of the corner portions, the plurality of connection pads 103A can be placed without any interference therebetween. Because of this, it is seen that the mounting substrate 100 is constructed such that the semiconductor chip in which the connecting portions are placed at narrower intervals can easily be mounted thereon.

Figure 4:
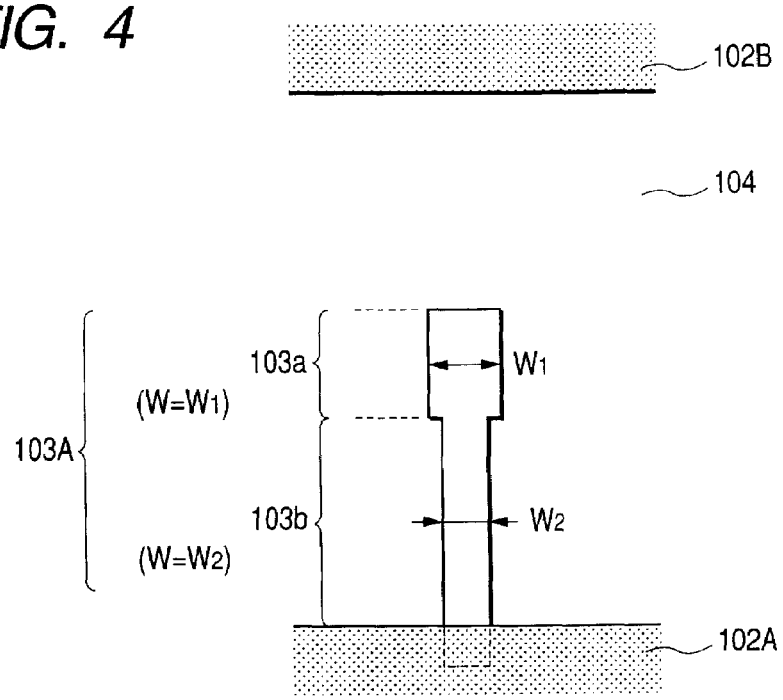
FIG. 4 is a (first) drawing which shows connection pads of the mounting substrate of the first embodiment.

FIG. 4 is an enlarged view which shows a state in which the connection pad 103A is placed. In the description of the connection pad 103A, like reference numerals will be given to those that have been described before, so that the description thereof will be omitted therein. Referring to FIG. 4, the connection pad 103A which is covered by the solder resist layer 102A at the end portion thereof has a construction in which a pad area 103a and a pad area 103b are connected together to form the connection pad 103A. In addition, a width W1 of the pad area 103a is configured so as to become wider than a width W2 of the pad area 103b.

Since it has the construction described above, the connection pad 103A provides an advantage that the electrical connection thereof with the connecting portion (for example, a Au bump) on the semiconductor chip can be facilitated. The reason therefor will be described based on a forming method of a connecting portion with the semiconductor chip shown in FIGS. 5A, 5B. In the description of the forming method, like reference numerals will be given to those that have been described before, so that the description thereof will be omitted.

Figure 5A:
FIGS. 5A, 5B are drawings which show a method for forming solder connecting portions on the connection pads shown in FIG. 4.

Firstly, in a state shown in FIG. 5A, a metallic layer 103S having a low melt point which is made of, for example, a solder is formed on the connection pad 103A (the pad areas 103a, 103b) in advance. In this case, while the metallic layer 103S is formed of, for example, minute solder powder or by virtue of metal plating of a solder, the invention is not limited to such methods.

Figure 5B:
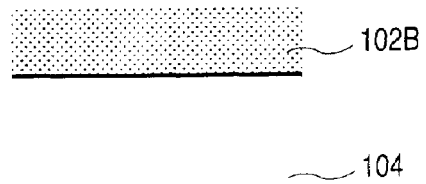
Figure 5B:
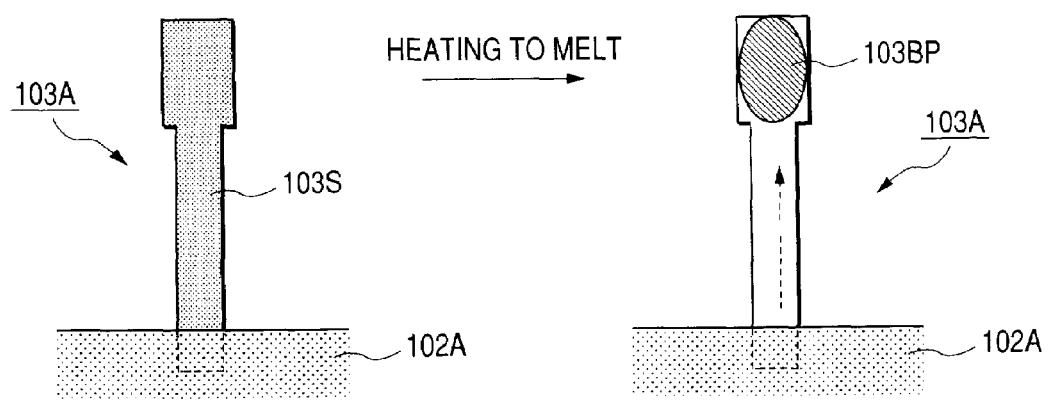

Next, in a state shown in FIG. 5B, the connection pad 103A (the mounting substrate) is heated so as to melt the metallic layer 103S. At this point in time, the solder so melted is gathered from the pad area 103b whose width W2 is narrower to the pad area 103a whose width W1 is wider by virtue of surface tension, so as to form a connecting portion 103PB made of solder. For example, a connecting portion (a Au bump or the like) of the semiconductor chip which is placed at, for example, the pad area 103a is electrically connected to the connection pad 103A by the connecting portion 103BP.

In the mounting substrate according to this embodiment, since the connecting portion is formed by virtue of the surface tension of the metal which is melt as described above, the area of the connection pad (an area where a metallic layer formed by the melted metal) is preferably the same between a plurality of connection pads.

Figure 6:
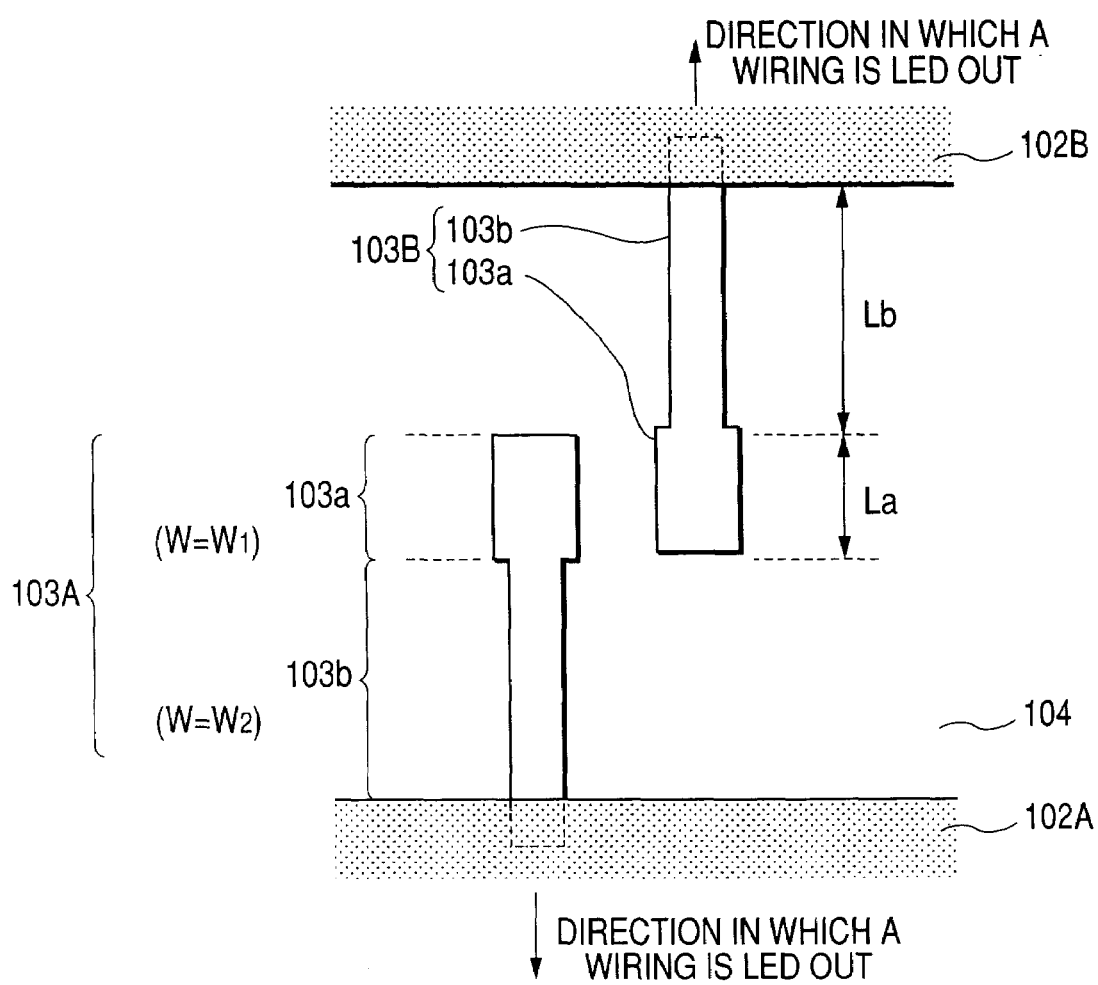
FIG. 6 is a (second) drawing which shows the connection pads of the mounting substrate shown in FIG. 3.

FIG. 6 is an enlarged view of an area B of the mounting substrate shown in FIG. 3, which shows a state in which the connection pad 103A and the connection pad 103B are placed adjacent to each other. In the description of the state, like reference numerals will be given to those that have been described before, so that the description thereof will be omitted.

Referring to FIG. 6, in the mounting substrate 100 of this embodiment, a portion of the connection pad 103A which is exposed from the solder resist layer and a portion of the connection pad 103B which is exposed from the solder resist layer have the same shapes, and the portions which are exposed from the solder resist layers are configured so as to have the same areas. For example, as with the connection pad area 103A, the connection pad 103B has a pad area 103a having a width W1 and a pad area 103b having a width W2. In addition, in the connection pad 103A and the connection pad 103B, the pad areas 103a are formed so as to have the same lengths La, and the pad areas 103b are formed so as to have the same lengths Lb.

Because of this, the connection pad 103A and the connection pad 103B are identical to each other in the area of the portion which is exposed from the solder resist layer, as well as the area where the metallic layer 103S is formed. Consequently, scattering of formations (volume, shape) of connecting portions which are used when connected with the semiconductor chip over the plurality of connection pads 103 is decreased, thereby making it possible for the semiconductor chip to be mounted on the mounting substrate with improved reliability.

For example, in the event that there exists a difference in exposed area between the connection pads, there is produced variability of formation of connecting portions, and therefore, there may occur a case where the reliability in connecting the semiconductor chip to the mounting substrate is decreased.

FIGS. 7A, (B) are drawings which exemplarily show a problem with a case where connecting portions each made of a solder are formed on connection pads whose exposed areas differ.

Firstly, FIG. 7A is a drawing which shows a state in which metallic surfaces are formed on the electrode pad 103A and an electrode pad 103X whose exposed area differs from that of the electrode pad 103A, respectively. Here, when the respective connection pads are heated for the metallic layers thereon to melt, connecting portions which are formed on the respective connection pads differ in resulting size from each other as is shown in FIG. 7B. Because of this, when the semiconductor chip (Au bumps) is connected, scattering of sizes of connecting portions occurs over the plurality of connection pads, whereby there may occur a case where the reliability in mounting the semiconductor chip on the mounting substrate is decreased.

Figure 1:
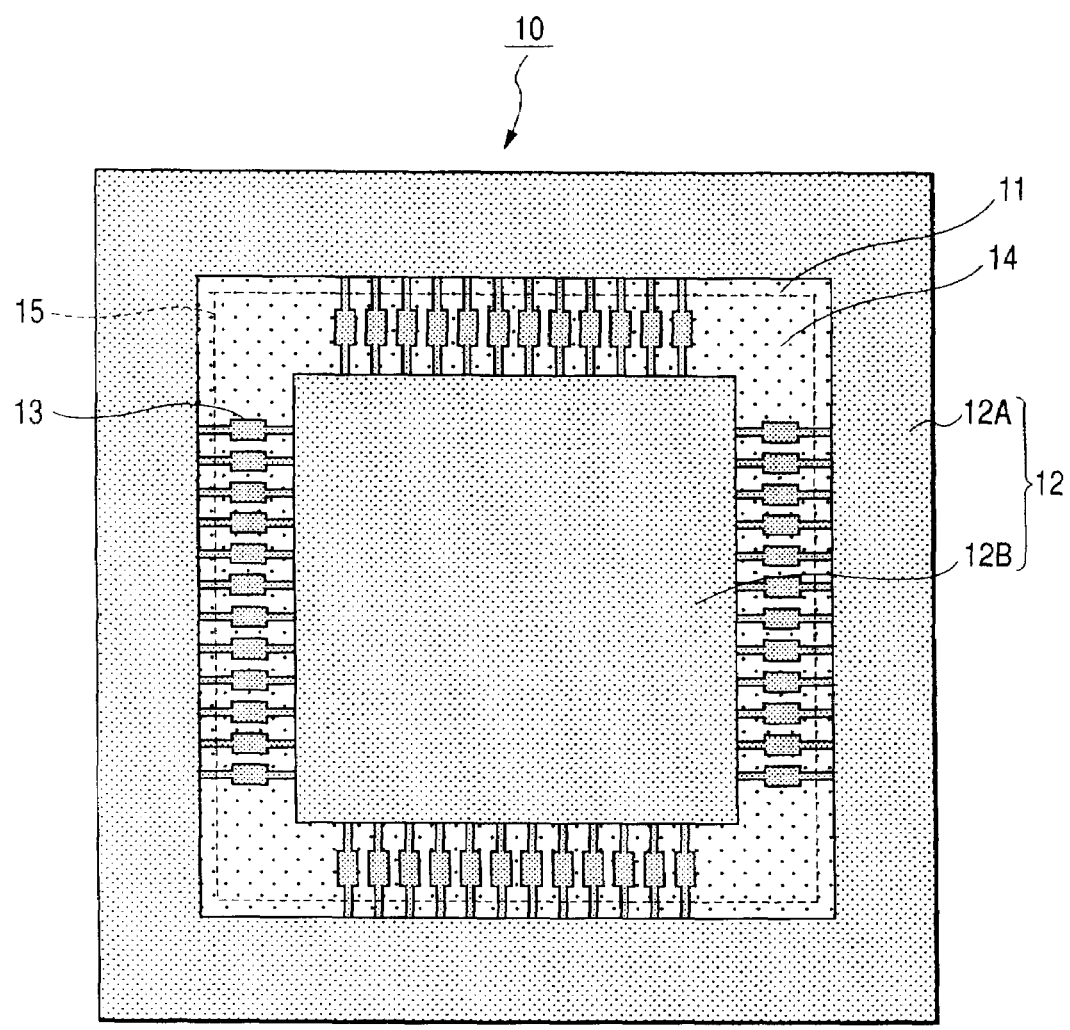
FIG. 1 is a drawing which shows a related-art mounting substrate.
Figure 2:
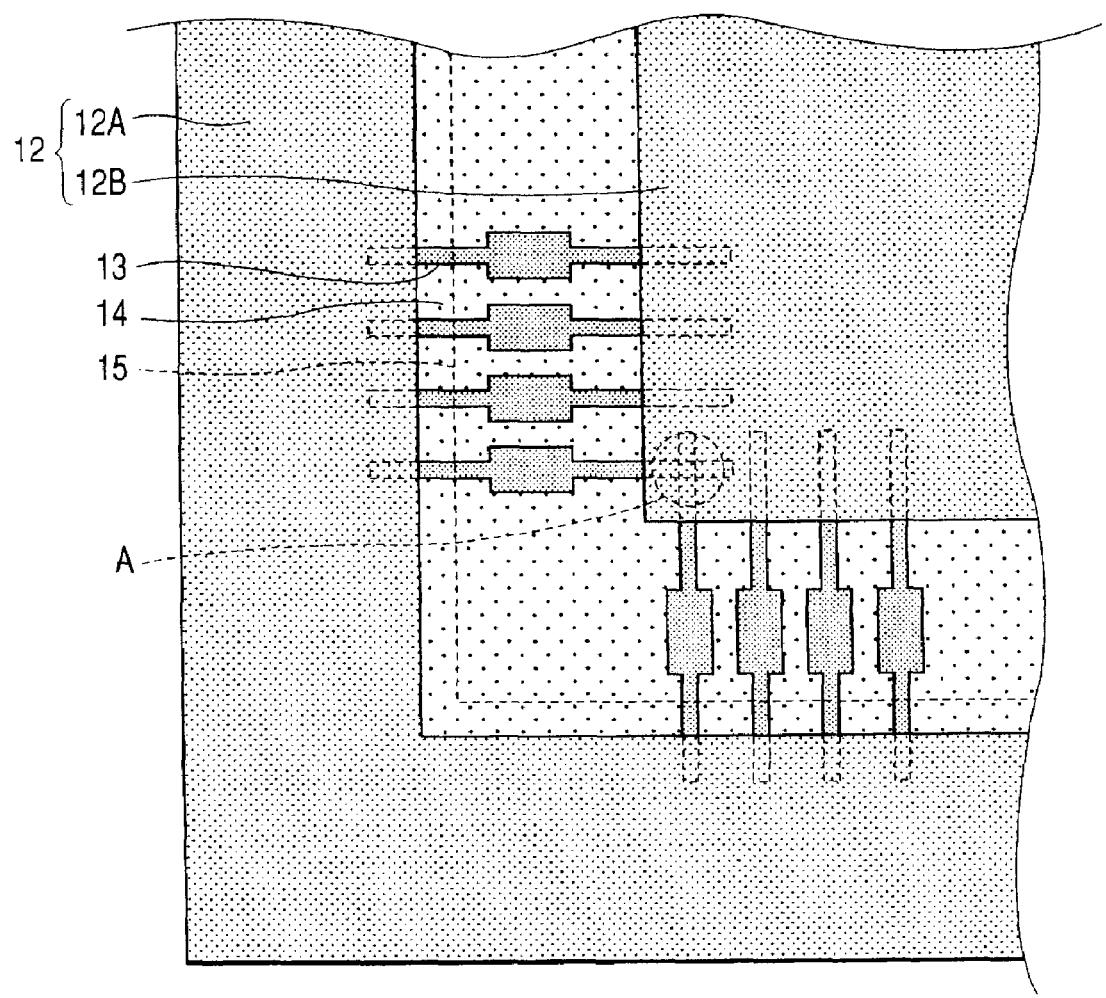
FIG. 2 is a drawing which shows a problem inherent in the related-art mounting substrate.

For example, in the related-art mounting substrate shown in FIG. 1, in the event that a construction is adopted in which only the portions are deleted where the connection pads interfere with each other, the areas where the connection pads are exposed differ as is shown in FIG. 7, causing concern that the reliability in connecting the semiconductor chip to the mounting substrate is decreased.

On the other hand, with the mounting substrate according to this embodiment, since the connection pad 103A and the connection pad 103B are formed such that the exposed areas thereof are the same, scattering of shapes of connecting portions which are used when connecting the semiconductor chip to the mounting substrate is suppressed, thereby making it possible for the semiconductor chip to be mounted on the mounting substrate.

Namely, with the mounting substrate 100 according to the invention, the high-performance semiconductor chip in which the connecting portions are placed at narrower intervals can be mounted thereon, and the reliability of the connecting portions of the semiconductor chip is improved.

In addition, while in the embodiment, the connection pads 103A are formed in the vicinity of the corner portions of the solder resist layer 102B and the connection pads 103B are arranged between the connection pads 103A (or between portions in the vicinity of the corner portions), the invention is not limited thereto.

Figure 8:
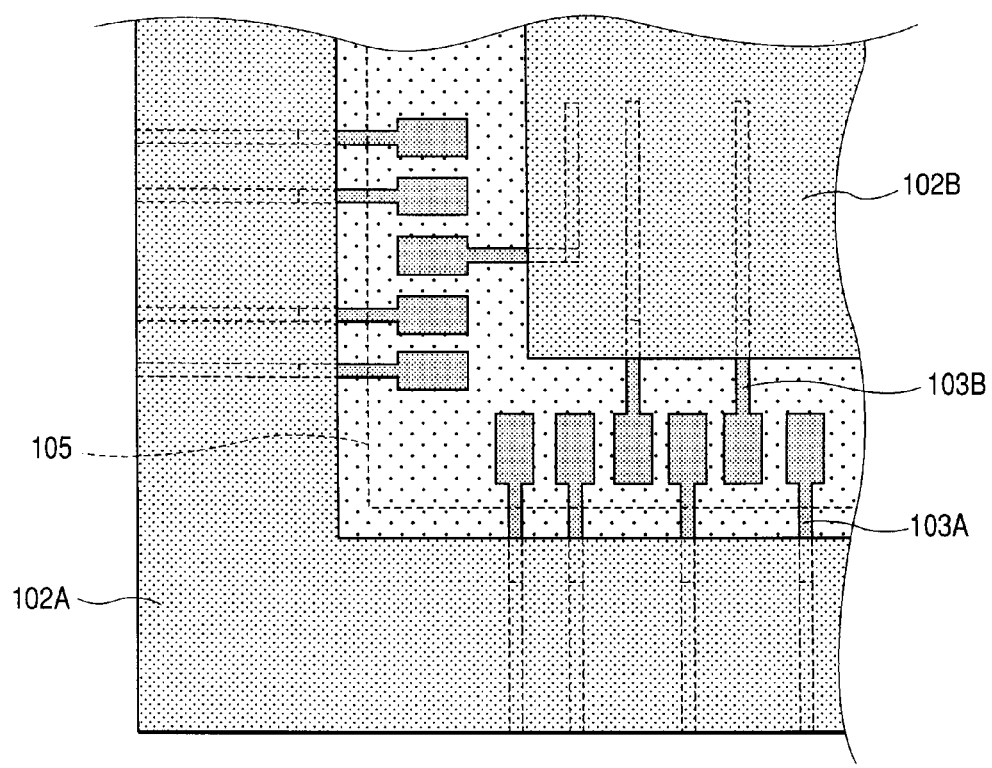
FIG. 8 is a drawing which shows a modified example made to the mounting substrate shown in FIG. 3.

FIG. 8 is a drawing showing a modified example made to the mounting substrate 100 shown in FIG. 3. In the description of the modified example, like reference numerals will be given to those that have been described before, so that the description thereof will be omitted. As is shown in FIG. 8, the connection pads 103A and the connection pads 103B can be disposed variously as required. For example, the arrangement of the connection pads 103A and the connection pads 103B can be modified variously according to, for example, the specification of the semiconductor chip and the layout of wirings on the mounting substrate.

Next, an example of a fabricating method of the mounting substrate 100 will be described based on FIGS. 9A to 9I. In the description of the method, like reference numerals will be given to the portions which have been described before, so that the description thereof will be omitted.

Figure 9A:
FIG. 9A is a (first) drawing which shows a fabricating method of the mounting substrate shown in FIG. 3.

Firstly, in a step shown in FIG. 9A, an etch stop layer 112 made up of a plated layer of Ni or Sn is formed on a supporting substrate 111 made of, for example, Cu.

Figure 9B:
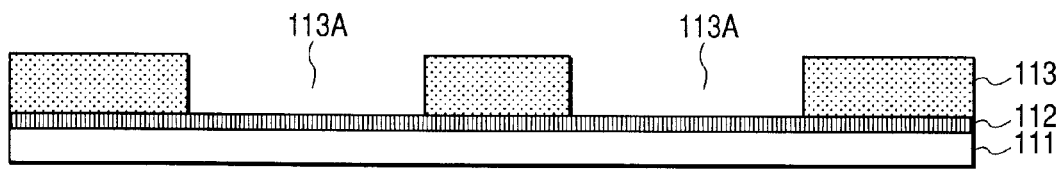
FIG. 9B is a (second) drawing which shows the fabricating method of the mounting substrate shown in FIG. 3.

Next, in a step shown in FIG. 9B, a resist layer is formed on the etch stop layer 112 by laminating a dry film resist thereon, and the resist layer is patterned using a photolithography method, so as to form a resist pattern 113 which has openings 113A therein.

Figure 9C:
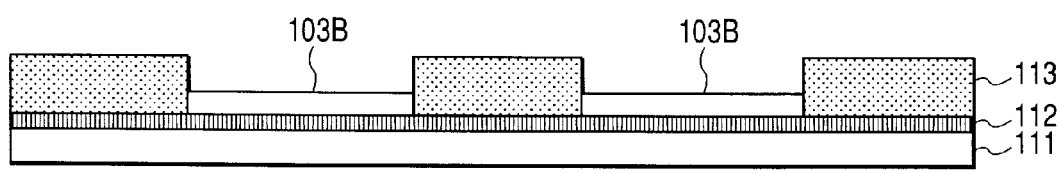
FIG. 9C is a (third) drawing which shows the fabricating method of the mounting substrate shown in FIG. 3.

Next, in a step shown in FIG. 9C, connection pads 103B made of Cu are formed on the etch stop layers 112 in the openings 113A by, for example, a plating method. In this case, although not shown, connection pads 103A are also formed at the same time as the formation of the connection pads 103B.

Figure 9D:
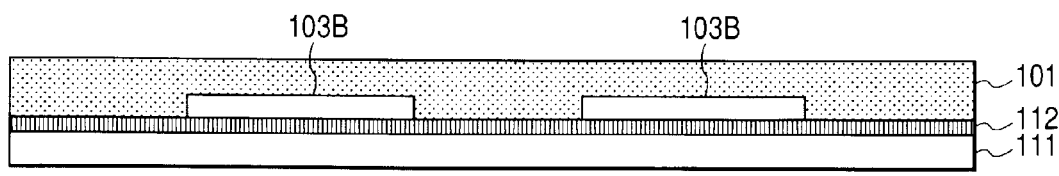
FIG. 9D is a (fourth) drawing which shows the fabricating method of the mounting substrate shown in FIG. 3.

Next, in a step shown in FIG. 9D, after the resist pattern 113 is removed from the supporting substrate 111, an insulation layer 101 made of a so-called build up resin such as an epoxy resin or a polyimide resin is formed in such a manner as to cover the connection pads 103B through laminating.

Figure 9E:
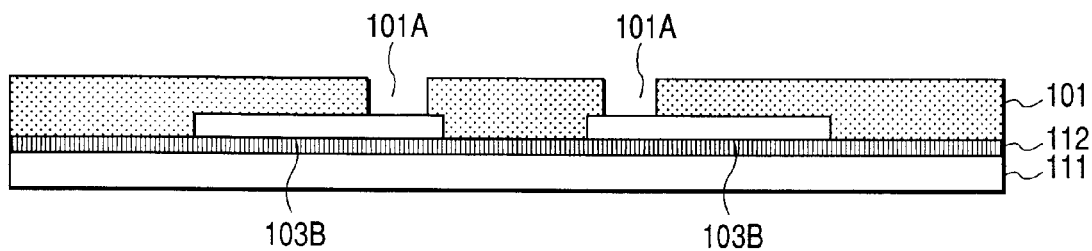
FIG. 9E is a (fifth) drawing which shows the fabricating method of the mounting substrate shown in FIG. 3.

Next, in a step shown in FIG. 9E, via holes 101A are formed in the insulation layer 101 in such a manner as to reach the connection pads 103B by the use of, for example, a YAG laser.

Figure 9F:
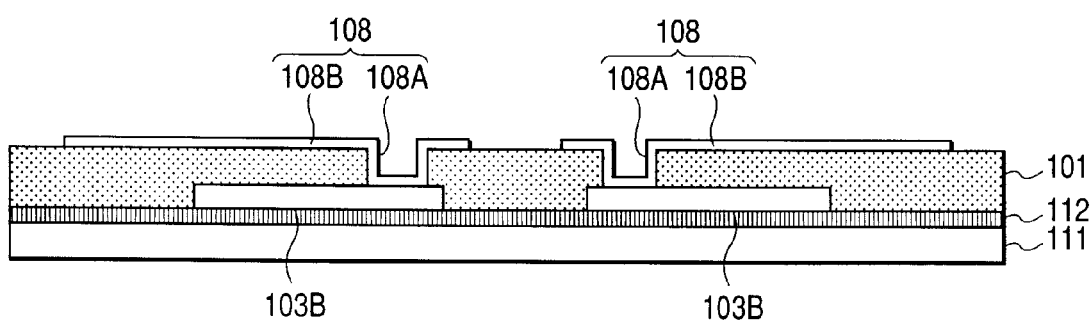
FIG. 9F is a (sixth) drawing which shows the fabricating method of the mounting substrate shown in FIG. 3.

Next, in a step shown in FIG. 9F, by the use of the plating method using Cu, via plugs 108A which are connected to the connection pads 103B are formed on inner walls of the via holes 101, and patterned wirings 108B which are connected to the via plugs 108A are formed on the insulation layer 111, so as to form the wiring portions 108.

Figure 9G:
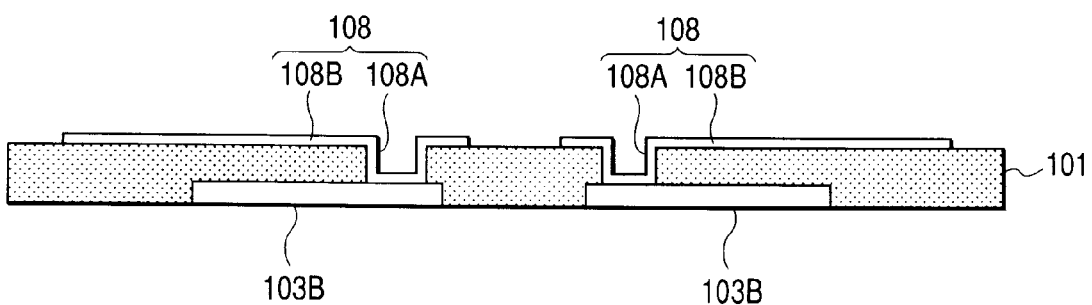
FIG. 9G is a (seventh) drawing which shows the fabricating method of the mounting substrate shown in FIG. 3.

Next, in a step shown in FIG. 9G, the supporting substrate 111 and the etch stop layer 112 are removed by etching so as to realize a state in which the connection pads 103B are exposed.

Figure 9H:
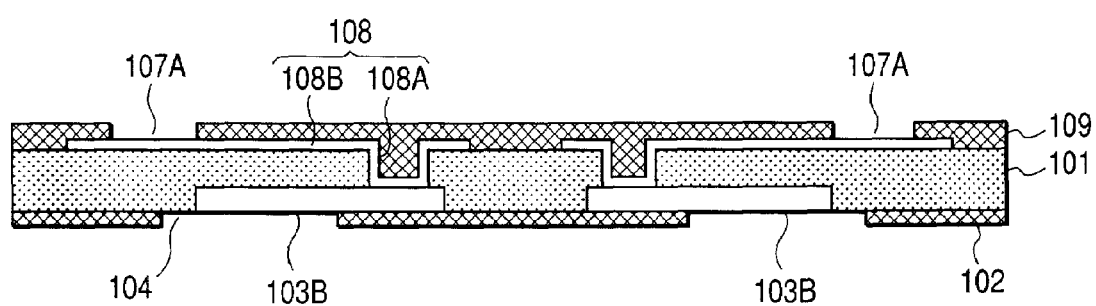
FIG. 9H is an (eighth) drawing which shows the fabricating method of the mounting substrate shown in FIG. 3.

Next, in a step shown in FIG. 9H, a solder resist layer 102 having openings 104 is formed in such a manner as to cover end portions of the connection pads 103B. In addition, the connection pads 103B are made to be exposed from the openings 104.

Similarly, a solder resist 109 having openings 107A is formed in such a manner as to cover the wiring portions 108. In addition, the patterned wirings 108B are made to be exposed partially from the openings 107A.

Figure 9I:
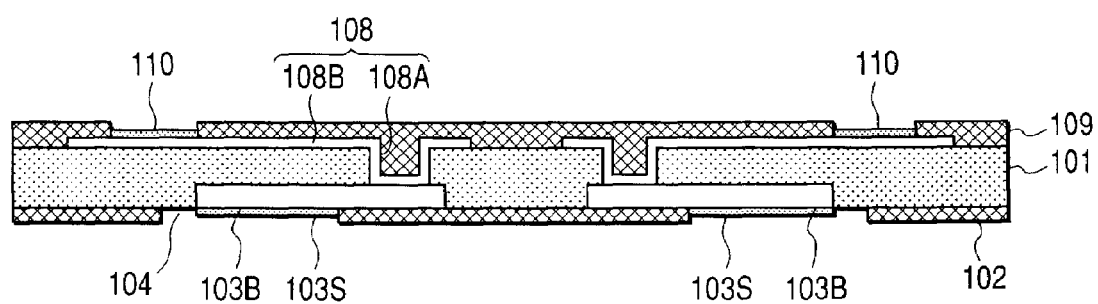
FIG. 9I is a (ninth) drawing which shows the fabricating method of the mounting substrate shown in FIG. 3.

Next, in a step shown in FIG. 9I, metallic layers 103S each made of, for example, a solder are formed on surfaces of the connection pads 103B which are exposed from the solder resist layer 102. Similarly, metallic layers 110 each made of, for example, a solder is formed on surfaces of the patterned wirings 108B which are exposed from the solder resist layer 107.

Thus, the mounting substrate 100 shown in FIG. 3 can be fabricated.

Second Embodiment

Figure 10:
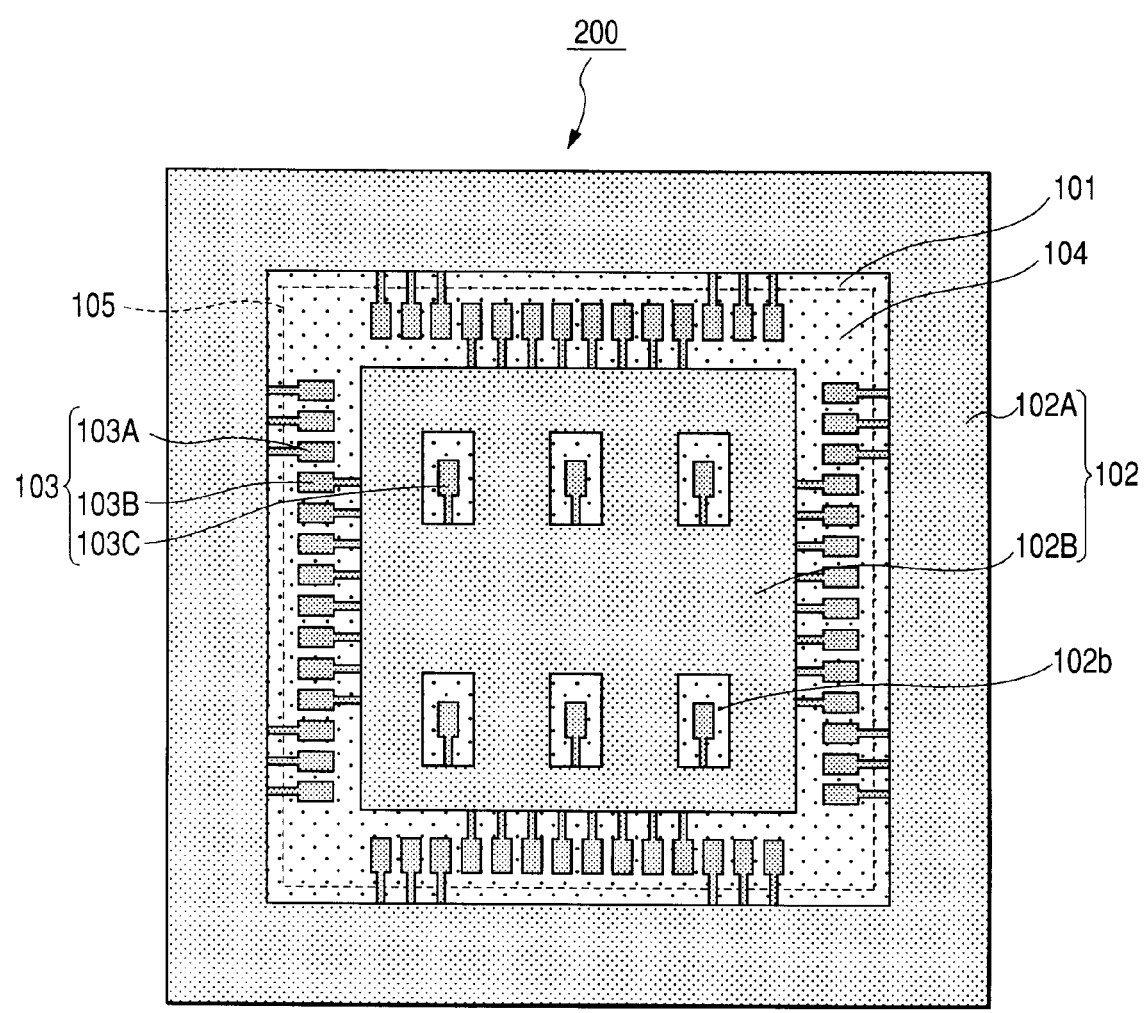
FIG. 10 is a drawing which shows a mounting substrate according to a second embodiment.

In addition, FIG. 10 is a drawing which shows a mounting substrate 200 according to a second embodiment of the invention. In the description of this second embodiment, like reference numerals will be given to those that have been described before, so that the description thereof will be omitted. In addition, the mounting substrate 200 is regarded as the same as the mounting substrate 100 unless described otherwise.

Referring to FIG. 10, in the mounting substrate 200 according to this embodiment, openings 102b are formed in the solder resist layer 102. In addition, connection pads 103C are formed on the insulation layer 101 in such a manner as to be exposed from the openings 102b. As with the connection pads 103B, the connection pads 103C are formed in such a manner as to be covered by the solder resist layer 102B at end portions thereof.

Since the mounting substrate 200 according to this embodiment has the construction that has been described above, for example, a semiconductor chip having connecting portions formed at a central portion thereof can be mounted thereon. For example, the connection pads 103C are connected to a power supply line or a grounding line of the semiconductor chip which is mounted on the mounting substrate 200. In recent years, there is a strong demand, in particular, for semiconductor chips which consumes less electric power (or semiconductor chips which operates at a low voltage), and to deal with the trend of low voltage operation, the lines of the power supply system are preferably formed in the vicinity of a central portion of a semiconductor chip where devices of the semiconductor chip are formed. Because of this, in semiconductor chips which are designed to cope with the low voltage operation, in order to strengthen the lines for the power supply system, there may be adopted a configuration in which lines for the power supply system are provided additionally in the vicinity of the center of the semiconductor chip.

A semiconductor chip like this which can deal with the low voltage can be mounted on the mounting substrate according to the embodiment.

In addition, in the construction that has been described above, an exposed area of the connection pad 103C is preferably formed so as to be the same as the exposed area of the connection pad 103A and the exposed area of the connection pad 103B. As this occurs, scattering of shapes of connecting portions which are used when the semiconductor chip is connected to the mounting substrate can be suppressed, thereby making it possible to mount the semiconductor chip on the mounting substrate with improved reliability.

Thus, while the invention has been described based on the preferred embodiments, the invention is not limited to those specific embodiments that have been described heretofore but can be modified and/or changed variously without departing from the spirit and scope of the invention which are described under the claims of the invention.

According to the invention, the mounting substrate can be provided which can deal with the trend of narrowing intervals at which connecting portions are placed on the semiconductor chip which is mounted thereon.

What is claimed is:

1. A mounting substrate on which a semiconductor chip is mounted using a flip chip bonding, comprising:
   a plurality of connection pads to be connected to the semiconductor chip; and
   an insulation layer formed in such a manner as to cover the connection pads partially,
   wherein the insulation layer includes a quadrangular first insulation layer having four sides which is formed in such a manner as to correspond to a center of the semiconductor chip and a second insulation layer which is formed so as to surround the first insulation layer such that a space is provided between the first and second insulation layers, and
   wherein the plurality of connection pads include first connection pads which are partially covered by only the first insulation layer and second connection pads which are partially covered by only the second insulation layer,
   wherein each of said four sides of the first insulation layer consist of a first end region, a second end region, and a central region disposed between the first and second end regions, said first and second end regions extending from an intersection of each side with an adjacent side to the central region, and
   wherein each of the first connection pads are disposed only at the central region and each of said second connection pads are disposed only at the first and second end regions.

2. The mounting substrate as set forth in claim 1, wherein the insulation layer is made up of a solder resist layer.

3. The mounting substrate as set forth in claim 1, wherein an exposed area of the first connection pad and an exposed area of the second connection pad are the same.

4. The mounting substrate as set forth in claim 1, wherein the plurality of connection pads further include third connection pads which are exposed from an opening formed in the first insulation layer.

5. The mounting substrate as set forth in claim 4, wherein an exposed area of the third connection pad is the same as the exposed area of the first connection pad and the exposed area of the second connection pad.

* * * * *